United States Patent
Liang et al.

(10) Patent No.: US 10,486,394 B2
(45) Date of Patent: Nov. 26, 2019

(54) RECYCLABLE COPPER CLAD LAMINATES CONTAINING FIBER COMPOSITION

(71) Applicant: Adesso Advanced Materials Wuhu Co., Ltd., Wuhu (CN)

(72) Inventors: Bo Liang, Plainsboro, NJ (US); Bing Qin, Shanghai (CN); Xin Li, Cambridgeshire (GB)

(73) Assignee: ADESSO ADVANCED MATERIALS WUHU CO., LTD., Wuhu (CN)

( * ) Notice: Subject to any disclaimer, the term of this patent is extended or adjusted under 35 U.S.C. 154(b) by 0 days.

(21) Appl. No.: 15/534,960

(22) PCT Filed: Dec. 16, 2015

(86) PCT No.: PCT/CN2015/097551
§ 371 (c)(1),
(2) Date: Jun. 9, 2017

(87) PCT Pub. No.: WO2016/095817
PCT Pub. Date: Jun. 23, 2016

(65) Prior Publication Data
US 2017/0368800 A1    Dec. 28, 2017

(30) Foreign Application Priority Data
Dec. 16, 2014    (CN) .......................... 2014 1 0781355

(51) Int. Cl.
*B32B 15/092*     (2006.01)
*B32B 27/26*     (2006.01)
(Continued)

(52) U.S. Cl.
CPC ............ *B32B 15/092* (2013.01); *B32B 15/20* (2013.01); *B32B 19/02* (2013.01); *B32B 19/041* (2013.01);
(Continued)

(58) Field of Classification Search
CPC ....... B32B 15/092; B32B 15/20; B32B 19/02; B32B 19/041; B32B 2260/023;
(Continued)

(56) References Cited

U.S. PATENT DOCUMENTS

| | | | | |
|---|---|---|---|---|
| 4,557,784 A | * | 12/1985 | Uekita | ................... B32B 38/08 156/307.7 |
| 2003/0153650 A1 | * | 8/2003 | Tada | ................... C08G 59/621 523/400 |

(Continued)

FOREIGN PATENT DOCUMENTS

| | | | |
|---|---|---|---|
| CN | 103012747 A | | 4/2013 |
| CN | 103059517 A | | 4/2013 |

(Continued)

OTHER PUBLICATIONS

"A Comprehensive Introduction to Copper Clad Laminate", PCBCart, 2005, https://www.pcbcart.com/article/conent/copper-clad-laminate.html, retrieved from the Internet on Feb. 12, 2019.*

(Continued)

*Primary Examiner* — Frances Tischler
(74) *Attorney, Agent, or Firm* — Jacob M. Ward; Ward Law Office LLC

(57) ABSTRACT

The present invention provides recyclable copper clad laminates (CCLs) each including copper foil and a recyclable/degradable fiber composition, and printed circuit boards that are made of or include the CCLs of this invention. Also provided are method for recycling these CCLs and printed circuit boards.

1 Claim, 1 Drawing Sheet

Before degradation      After partial degradation

(51) Int. Cl.
- *B32B 27/38* (2006.01)
- *C08L 63/00* (2006.01)
- *B32B 15/20* (2006.01)
- *C08G 59/50* (2006.01)
- *C08G 59/54* (2006.01)
- *C09J 163/00* (2006.01)
- *H05K 1/03* (2006.01)
- *H05K 3/00* (2006.01)
- *C08J 5/24* (2006.01)
- *B32B 19/02* (2006.01)
- *B32B 19/04* (2006.01)
- *B32B 27/08* (2006.01)

(52) U.S. Cl.
CPC .............. *B32B 27/08* (2013.01); *B32B 27/26* (2013.01); *B32B 27/38* (2013.01); *C08G 59/50* (2013.01); *C08G 59/504* (2013.01); *C08G 59/54* (2013.01); *C08J 5/24* (2013.01); *C08L 63/00* (2013.01); *C09J 163/00* (2013.01); *H05K 1/0326* (2013.01); *H05K 1/0366* (2013.01); *H05K 3/00* (2013.01); *B32B 2260/023* (2013.01); *B32B 2260/046* (2013.01); *B32B 2262/101* (2013.01); *B32B 2307/716* (2013.01); *B32B 2457/08* (2013.01); *C08J 2363/02* (2013.01); *C08K 2201/018* (2013.01); *H05K 2201/012* (2013.01); *H05K 2203/178* (2013.01); *Y02P 70/611* (2015.11); *Y02P 70/613* (2015.11)

(58) Field of Classification Search
CPC ........ B32B 2260/046; B32B 2262/101; B32B 2307/716; B32B 2457/08; B32B 27/08; B32B 27/26; B32B 27/38; C08G 59/50; C08G 59/504; C08G 59/54; C08J 2363/02; C08J 5/24; C08K 2201/018; C08L 63/00; C09J 163/00; H05K 1/0326; H05K 1/0366; H05K 2201/012; H05K 2203/178; H05K 3/00; Y02P 70/611; Y02P 70/613

See application file for complete search history.

(56) References Cited

U.S. PATENT DOCUMENTS

2010/0092764 A1* 4/2010 Chung .................. B32B 15/14
428/331
2011/0143618 A1 6/2011 Wei et al.

FOREIGN PATENT DOCUMENTS

| CN | 103249712 A | 8/2013 |
|---|---|---|
| CN | 103254406 A | 8/2013 |
| CN | 103483554 A | 1/2014 |
| CN | 104527177 A | 4/2015 |
| EP | 3231829 A1 | 10/2017 |
| WO | 2014169847 A1 | 10/2014 |

OTHER PUBLICATIONS

Supplementary Search Report dated Jul. 13, 2018, in parallel European patent application No. 15869324.2, nine pages.

* cited by examiner

Before degradation          After partial degradation

Cu 35 μ 3
1080PP 76μm

FR4 1.3mm
1080PP 76μm
Cu 35μm

RECYCLABLE COPPER CLAD LAMINATES CONTAINING FIBER COMPOSITION

REFERENCE TO RELATED APPLICATIONS

The application is a U.S. national phase application of international application No. PCT/CN2015/097551, filed on Dec. 16, 2015, which claims priority to Chinese application No. 201410781355.9, filed on Dec. 16, 2014, the contents of which are incorporated herein in their entireties.

BACKGROUND OF THE INVENTION

The main raw materials of CCL include composite foil, reinforcing fiber cloth, epoxy resin, curing agents, accelerators, solvents, fillers, etc., which is closely related to the process performance, processing performance, the overall performance of the final product during the production process of CCL. The laminate with one or both two sides of the substrate coated with a metal foil is called CCL, mainly for the production of printed circuit boards, is widely used in the products of telecommunications, mobile communications, computers, instrumentation, digital TV, digital audio, satellite, radar and others. In recent years the CCL has been used in solar cells, LED lighting, LED backlight, flat panel displays, automotive electronics and other new products field. In the electronic complete-machine products, CCL plays the role of the three elements which are load components, the circuit interconnection, and insulation between the circuits.

The wide use of this epoxy resin formula in CCL is due to its excellent machining performance before curing and excellent adhesion, mechanical strength, thermal dispersion, electricity performance and chemical resistance after curing. Besides, high density and three-dimensional network structure of the cured epoxy resin make it extremely durable hard materials, which can bear the influence of a wide range of environmental conditions. In meantime, after curing, the crosslinked network structure of epoxy resin makes it difficult to remove, recycle and reuse. Essentially, the cross-linking reaction applying polyamine and epoxy resin is irreversible, thus, this material can't be remelt, remolded without loss, or easily dissolved.

The CCL prepared by thermosetting epoxy resin with a combination of copper foil and fiber can be applied to the field of printed circuit board (PCB). The manufacturing process of PCB generally goes through the film plate making, pattern transfer, chemical etching, via hole and copper foil process, flux and solder resist process and other processes. Epoxy resin after curing is difficult to decompose and melt. Accordingly, epoxy based circuit board is difficult to recycle.

At home and abroad, the recycling technology of waste printed circuit board is mainly three categories: the first one is wet processing technology, including pickling, corrosion and others; the second one is fire treatment technology, including incineration, pyrolysis, direct smelting and others; the last one is physical and mechanical processing technology, including crushing and sorting processes. In general, these methods have their limitations in varying degrees, the processing scale of fire treatment technology is largest, the recovery of wet processing technology for metal is higher, but wet processing technology and fire treatment technology generate enormous environmental pollution and the environmental cost is very large. And the physical and mechanical treatment method, with a small investment and recovering metal, can not achieve the recovery of fiber and resin. Therefore, the effective and feasible environmental recycling method of waste material is still a question to be addressed in the material field.

SUMMARY OF THE INVENTION

To solve the problems described above, this present invention provides recyclable compositions (e.g., prepreg or cured) and methods for preparing and recycling these recyclable compositions. As particular examples of the present invention, copper-clad laminate (CCL) is provided and found to be very suitable for printed circuit boards. The CCL prepared by this invention can achieve every performance indicator and the recovery or recycling method can be carried out under mild conditions, is economical and easy to control.

In one aspect, the present invention provides a recyclable copper clad laminate (CCL) with copper foil and a recyclable fiber composition.

In some embodiments, the recyclable fiber composition comprises a recyclable fiber prepreg or a cured recyclable fiber composite. For instance, the recyclable fiber prepreg can include a partially cured degradable epoxy resin composition and glass fiber which is embedded in the partially cured degradable epoxy resin composition; and the cured fiber composite can include a cured degradable epoxy resin composition and glass fiber which is embedded in the cured degradable epoxy resin composition.

In some other embodiments, the degradable epoxy resin composition can include an epoxy resin and a degradable curing agent.

As examples, the degradable curing agent can be a compound of Formula (I), Formula (II), Formula (III), Formula (IV), or Formula (V) as shown below:

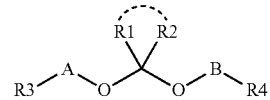

(I)

wherein
each of R1 and R2, independently, is hydrogen, alkyl, cylcoalkyl, heterocyclic, heterocycloalkyl, alkenyl, cycloalkenyl, aryl, heteroaryl, alkyl-hetero-alkyl, alkynyl, alkylene, alkylene-hetero-alkylene, alkenylene, alkylene-hetero-alkenylene, alkynylene, or alkylene-hetero-alkynylene; and R1 and R2 can be the same or different; or
R1 and R2, together with the same carbon atom to which they are attached, form a ring structure;
each of A and B, independently, is alkylene, alkenylene, alkynylene, arylene, alkylene-arylene, alkenylene-arylene, alkynylene-arylene, heteroarylene, alkylene-heteroarylene, alkenylene-heteroarylene, or alkynylene-heteroarylene;
A and B may be the same or different;
each of R3 and R4, independently, is

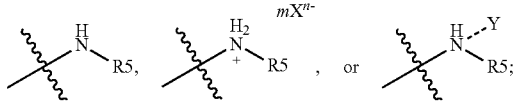

each R5 independently is hydrogen, alkyl, cylcoalkyl, heterocyclic, heterocycloalkyl, alkenyl, cycloalkenyl, aryl, heteroaryl, alkoxyalkyl, or alkynyl;

each $X^{n-}$ independently is a $C_{1-10}$ aliphatic carboxylate ion, a $C_{1-10}$ cycloaliphactic carboxylate ion, an aromatic carboxylate ion, or a heteroaromatic carboxylate ion;

n is 1, 2, or 3;

m is 0, 1, 2, or 3;

each Y independently is a Lewis add;

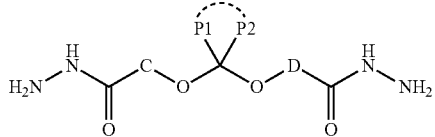

(II)

wherein each of P1 and P2, independently, is hydrogen, alkyl, cylcoalkyl, heterocyclic, heterocycloalkyl, alkenyl, cycloalkenyl, aryl, heteroaryl, alkyl-hetero-alkyl, alkynyl, alkylene, alkylene-hetero-alkylene, alkenylene, alkylene-hetero-alkenylene, alkynylene, or alkylene-hetero-alkynylene; and P1 and P2 can be the same or different; or P1 and P2, together with the same carbon atom to which they are attached, form a ring structure;

each of C and D, independently, is alkylene, alkylene-hetero-alkylene, alkenylene, alkenylene-hetero-alkenylene, alkylene-hetero-alkenylene, alkynylene, cycloalkylene, alkylene-cycloalkylene, alkylene-cycloalkylene-alkylene, alkenylene-cycloalkylene, alkenylene-cycloalkylene-alkenylene, alkylene-cycloalkylene-alkenylene, alkynylene-cycloalkylene, alkynylene-cycloalkylene-alkynylene, heterocycloalkylene, alkylene-heterocycloalkylene, alkylene-heterocycloalkylene-alkylene, alkenylene-heterocycloalkylene, alkenylene-heterocycloalkylene-alkenylene, alkylene-heterocycloalkylene-alkenylene, alkynylene-heterocycloalkylene, alkynylene-heterocycloalkylene-alkynylene, cycloalkenylene, alkylene-cycloalkenylene, alkylene-cycloalkenylene-alkylene, alkenylene-cycloalkenylene, alkenylene-cycloalkenylene-alkenylene, alkylene-cycloalkenylene-alkenylene, alkynylene-cycloalkenylene, alkynylene-cycloalkenylene-alkynylene, heterocycloalkenylene, alkylene-heterocycloalkenylene, alkylene-heterocycloalkenylene-alkylene, alkenylene-heterocycloalkenylene, alkenylene-heterocycloalkenylene-alkenylene, alkylene-heterocycloalkenylene-alkenylene, alkynylene-heterocycloalkenylene, alkynylene-heterocycloalkenylene-alkynylene, arylene, alkylene-arylene, alkylene-arylene-alkylene, alkenylene-arylene, alkenylene-arylene-alkenylene, alkylene-arylene-alkenylene, alkynylene-arylene, alkynylene-arylene-alkynylene, heteroarylene, alkylene-heteroarylene, alkylene-heteroarylene-alkylene, alkenylene-heteroarylene, alkenylene-heteroarylene-alkenylene, alkylene-heteroarylene-alkenylene, alkynylene-heteroarylene, alkynylene-heteroarylene-alkynylene; and C and D can be the same or different;

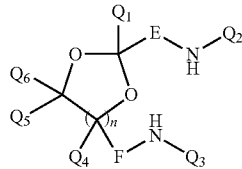

(III)

wherein each of $Q_1$, $Q_2$, $Q_3$, $Q_4$, $Q_5$, and $Q_6$, independently, is hydrogen, alkyl, cycloalkyl, heterocyclic, heterocyclic, alkenyl, cycloalkenyl, alkynyl, aryl, heteroaryl, alkylene-oxyalkyl, alkylene-oxy-alkyl, alkylene-oxy-hetero-cyclic, alkylene-oxy-hetero-cycloalkyl, alkylene-oxy-alkenyl, alkylene-oxy-cycloalkenyl, alkylene-aryl, alkylene-oxy-heteroaryl, cycloalkylene-oxy-alkyl, cycloalkylene-oxy-cycloalkyl, cycloalkylene-oxy-heterocyclic, cycloalkylene-oxy-heterocycloalkyl, cycloalkylene-oxy-alkenyl, cycloalkylene-oxy-cycloalkenyl, cycloalkylene-oxy-aryl, cycloalkylene-oxy-heteroaryl, heterocycloalkylene-oxy-alkyl, heterocycloalkylene-oxy-cycloalkyl, heterocycloalkylene-oxy-heterocyclic, heterocycloalkylene-oxy-heterocycloalkyl, heterocycloalkylene-oxy-alkenyl, heterocycloalkylene-oxy-cycloalkenyl, heterocycloalkylene-oxy-aryl, heterocycloalkylene-oxy-heteroaryl, arylene-oxy-alkyl, arylene-oxy-cycloalkyl, arylene-oxy-heterocyclic, arylene-oxy-heterocycloalkyl, arylene-oxy-alkenyl, arylene-oxy-cycloalkenyl, arylene-oxy-aryl, arylene-oxy-heteroaryl; and any two of $Q_1$, $Q_2$, $Q_3$, $Q_4$, $Q_5$ and $Q_6$ may be the same or different;

$Q_5$ and $Q_6$, together with the same carbon atom to which they are attached, form a ring structure;

$Q_1$ and E, together with the same carbon atom to which they are attached, form a ring structure;

$Q_4$ and F, together with the same carbon atom to which they are attached, form a ring structure;

each of E and F, independently, is alkylene, alkylene-hetero-alkylene, alkenylene, alkenylene-hetero-alkenylene, alkylene-hetero-alkenylene, alkynylene, cycloalkylene, alkylene-cycloalkylene, alkylene-cycloalkylene-alkylene, alkenylene-cycloalkylene, alkenylene-cycloalkylene-alkenylene, alkylene-cycloalkylene-alkenylene, alkynylene-cycloalkylene, alkynylene-cycloalkylene-alkynylene, heterocycloalkylene, alkylene-heterocycloalkylene, alkylene-heterocycloalkylene-alkylene, alkenylene-heterocycloalkylene, alkenylene-heterocycloalkylene-alkenylene, alkylene-heterocycloalkylene-alkenylene, alkynylene-heterocycloalkylene, alkynylene-heterocycloalkylene-alkynylene, cycloalkenylene, alkylene-cycloalkenylene, alkylene-cycloalkenylene-alkylene, alkenylene-cycloalkenylene, alkenylene-cycloalkenylene-alkenylene, alkylene-cycloalkenylene-alkenylene, alkynylene-cycloalkenylene, alkynylene-cycloalkenylene-alkynylene, heterocycloalkenylene, alkylene-heterocycloalkenylene, alkylene-heterocycloalkenylene-alkylene, alkenylene-heterocycloalkenylene, alkenylene-heterocycloalkenylene-alkenylene, alkylene-heterocycloalkenylene-alkenylene, alkynylene-heterocycloalkenylene, alkynylene-heterocycloalkenylene-alkynylene, Arylene, alkylene-arylene, alkylene-arylene-alkylene, alkenylene-arylene, alkenylene-arylene-alkenylene, alkylene-arylene-alkenylene, alkynylene-arylene, alkynylene-arylene-alkynylene, Heteroarylene, alkylene-heteroarylene, alkylene-heteroarylene-alkylene, alkenylene-heteroarylene, alkenylene-heteroarylene-alkenylene, alkylene-heteroarylene-alkenylene, alkynylene-heteroarylene, alkynylene-heteroarylene-alkynylene, carbonyl, thiocarbonyl, and E and F may be the same or different;

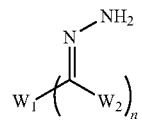

(IV)

wherein, n is an integer of 2 or greater;

$W_1$ is alkylene, alkylene-hetero-alkylene, alkenylene, alkenylene-hetero-alkenylene, alkylene-hetero-alkenylene, alkynylene, cycloalkylene, alkylene-cycloalkylene, alkylene-cycloalkylene-alkylene, alkenylene-cycloalkylene, alkenylene-cycloalkylene-alkenylen, alkylene-cycloalkylene-alkenylene, alkynylene-cycloalkylene, alkynylene-cycloalkylene-alkynylene, heterocycloalkylene, alkylene-heterocycloalkylene, alkylene-heterocycloalkylene-alkylene, alkenylene-heterocycloalkylene, alkenylene-heterocycloalkylene-alkenylene, alkylene-heterocycloalkylene-alkenylene, alkynylene-heterocycloalkylene, alkynylene-heterocycloalkylene-alkynylene, cycloalkenylene, alkylene-cycloalkenylene, alkylene-cycloalkenylene-alkylene, alkenylene-cycloalkenylene, alkenylene-cycloalkenylene-alkenylene, alkylene-cycloalkenylene-alkenylene, alkynylene-cycloalkenylene, alkynylene-cycloalkenylene-alkynylene, heterocycloalkenylene, alkylene-heterocycloalkenylene, alkylene-heterocycloalkenylene-alkylene, alkenylene-heterocycloalkenylene, alkenylene-heterocycloalkenylene-alkenylene, alkylene-heterocycloalkenylene-alkenylene, alkynylene-heterocycloalkenylene, alkynylene-heterocycloalkenylene-alkynylene, arylene, alkylene-arylene, alkylene-arylene-alkylene, alkenylene-arylene, alkenylene-arylene-alkenylene, alkylene-arylene-alkenylene, alkynylene-arylene, alkynylene-arylene-alkynylene, heteroarylene, alkylene-heteroarylene, alkylene-heteroarylene-alkylene, alkenylene-heteroarylene, alkenylene-heteroarylene-alkenylene, alkylene-heteroarylene-alkenylene, alkynylene-heteroarylene, or alkynylene-heteroarylene-alkynylene; and each $W_2$, independently, is hydrogen, alkyl, cylcoalkyl, heterocyclic, heterocycloalkyl, alkenyl, cycloalkenyl, aryl, heteroaryl, alkyl-hetero-alkyl, alkynyl, alkylene, alkylene-hetero-alkylene, alkenylene, alkylene-hetero-alkenylene, alkynylene, or alkylene-hetero-alkynylene.

Examples of a suitable epoxy resin can include but is not limited to glycidyl ether epoxy resin, glycidyl ester type epoxy resin, glycidyl amine type epoxy resin, aliphatic epoxy resin, alicyclic epoxy resin, or novolac epoxy resin.

As other examples, a degradable epoxy resin composition can further include an auxiliary material. Examples of a suitable auxiliary material include but are not limited to a promoting agent, diluent, toughening agent, thickening agent, adhesion promoter, brightener, pigment, addition component, coupling agent, filler, thixotropic agent, fire retardant, or antioxidant.

In some other embodiments, a suitable recyclable fiber composition includes glass fiber or natural fiber.

In another aspect, the present invention provides a method for recovering any of the recyclable copper clad laminates as described above. The method includes a step of using acid and solvent to degrade a degradable epoxy resin matrix in the recyclable copper clad laminates.

In some embodiments, the degradation step of the recovering method is carried out under the heating condition. For example, heating can be at 15-400° C. (or 40-150° C., or 60-100° C.) for 1-120 hours (or 1-80, 2-80, 5-45, 10-45, or 12-30 hours).

In some other embodiments, the acid used in the recovering method includes hydrochloric acid, hydrobromic acid, hydrofluoric acid, acetic acid, trifluoroacetic acid, lactic acid, formic acid, propionic acid, citric acid, methanesulfonic acid, p-toluenesulfonic acid, nitric acid, sulfuric acid, sulphurous acid, phosphoric acid, perchloric acid, benzoic acid, salicylic acid, or phthalic acid. For example, the acid can have a concentration of 0.1-90 wt % (e.g., 0.1-60 wt %, 1-50 wt %, 1-40 wt %, or 5-25 wt %).

In still some other embodiments, the solvent used in the recovering method includes methanol, ethanol, ethylene glycol, propyl alcohol, isopropyl alcohol, butanol, isobutanol, tertiary butanol, amyl alcohol, hexanol, heptanol, octanol, nonyl alcohol, heptanol, octanol, nonanol and benzyl alcohol, phenylethyl alcohol, p-dihydroxy methyl benzene, m-dihydroxy methyl benzene, o-dihydroxy methyl benzene, p-dihydroxy ethyl benzene, m-dihydroxy ethyl benzene, o-dihydroxy ethyl benzene, water, N,N-dimethyl formamide, N,N-dimethyl acetamide, N-methyl pyrrolidone, dimethyl sulfoxide, tetrahydrofuran, methyl tetrahydrofuran, glycerin, dioxane, or water.

In yet still some other embodiments, the recovering method can further includes a step of neutralizing, filtering, or causing precipitation of the degradation product.

In yet another aspect, the present invention also provides a recyclable printed circuit board (PCB) useful for electronic uses, wherein the recyclable PCB is made of or includes any of the recyclable copper clad laminates described above.

As used herein, the term "alkyl," when used alone or as part of a larger moiety (e.g., as in "cycloalkenylalkyl"), refers to a saturated aliphatic hydrocarbon group. It can contain 1 to 12 (e.g., 1 to 8, 1 to 6, or 1 to 4) carbon atoms. As a moiety, it can be denoted as —$C_nH_{2n+1}$. An alkyl group can be straight or branched. Examples of alkyl groups include, but are not limited to, methyl, ethyl, propyl, isopropyl, butyl, isobutyl, sec-butyl, tert-butyl, n-pentyl, n-heptyl, and 2-ethylhexyl. An alkyl group can be substituted (i.e., optionally substituted) with one or more substituents. When an alkyl is preceded by a carbon-number modifier, e.g., $C_{1-8}$, its means the alkyl group contains 1 to 8 carbon atoms.

As used herein, the term "alkylene," when used alone or as part of a larger moiety (e.g., as in "arylaalkyleneoxy"), refers to a saturated aliphatic hydrocarbon group with two radical points for forming two covalent bonds with two other moieties. It can contain 1 to 12 (e.g., 1 to 8, 1 to 6, or 1 to 4) carbon atoms. As a moiety, it can be denoted as —$C_nH_{2n}$—. Examples of an alkylene group include, but are not limited to, methylene (—$CH_2$—), ethylene (—$CH_2CH_2$—), and propylene (—$CH_2CH_2CH_2$—). When an alkylene is preceded by a carbon-number modifier, e.g., $C_{2-8}$, its means the alkylene group contains 2 to 8 carbon atoms.

As used herein, the term "alkynyl," when used alone or as part of a larger moiety (e.g., as in "alkynylalkyl"), refers to an aliphatic hydrocarbon group with at least one triple bond. It can contain 2 to 12 (e.g., 2 to 8, 2 to 6, or 2 to 4) carbon atoms. An alkynyl group can be straight or branched. Examples of an alkynyl group include, but are not limited to, propargyl and butynyl. When an alkynyl is preceded by a carbon-number modifier, e.g., $C_{2-8}$, its means the alkynyl group contains 2 to 8 carbon atoms.

As used herein, the term "alkenyl," when used alone or as part of a larger moiety (e.g., as in "alkenylalkyl""), refers to an aliphatic hydrocarbon group with at least one double bond. It can contain 2 to 12 (e.g., 2 to 8, 2 to 6, or 2 to 4) carbon atoms. An alkenyl group with one double bond can be denoted as —$C_nH_{2n-1}$, or —$C_nH_{2n-3}$ with two double bonds. Like an alkyl group, an alkenyl group can be straight or branched. Examples of an alkenyl group include, but are not limited to, allyl, isoprenyl, 2-butenyl, and 2-hexenyl. When an alkylene is preceded by a carbon-number modifier, e.g., $C_{3-8}$, its means the alkylene group contains 3 to 8 carbon atoms.

As used herein, the term "cycloalkyl," when used alone or as part of a larger moiety (e.g., as in "cycloalkylalkyl"), refers to a saturated carbocyclic mono-, bi-, or tri-cyclic (fused or bridged or spiral) ring system. It can contain 3 to 12 (e.g., 3 to 10, or 5 to 10) carbon atoms. Examples of cycloalkyl groups include, but are not limited to, cyclopropyl, cyclobutyl, cyclopentyl, cyclohexyl, cycloheptyl, adamantyl, norbornyl, cubyl, octahydro-indenyl, decahydronaphthyl, bicyclo[3.2.1]octyl, bicyclo[2.2.2]octyl, bicyclo [3.3.1]nonyl, bicyclo[3.3.2.]decyl, bicyclo[2.2.2]octyl, adamantyl, azacycloalkyl, or ((aminocarbonyl)cycloalkyl) cycloalkyl. When a cycloalkyl is preceded by a carbon-number modifier, e.g., $C_{3-8}$, its means the alkyl group contains 3 to 8 carbon atoms.

As used herein, the term "cycloalkenyl," when used alone or as part of a larger moiety (e.g., as in "cycloalkenylalkyl"), refers to a non-aromatic carbocyclic ring system having one or more double bonds. It can contain 3 to 12 (e.g., 3 to 10, or 5 to 10) carbon atoms. Examples of cycloalkenyl groups include, but are not limited to, cyclopentenyl, 1,4-cyclohexa-di-enyl, cycloheptenyl, cyclooctenyl, hexahydro-indenyl, octahydro-naphthyl, cyclohexenyl, cyclopentenyl, bicyclo[2.2.2]octenyl, orbicyclo[3.3.1]nonenyl.

As used herein, the term "heterocycloalkyl," when used alone or as part of a larger moiety (e.g., as in "heterocycloalkylalkyl" or "heterocycloalkoxy"), refers to a 3- to 16-membered mono-, bi-, or tri-cyclic (fused or bridged or spiral)) saturated ring structure, in which one or more of the ring atoms is a heteroatom (e.g., N, O, S, or combinations thereof). In addition to the heteroatom(s), the heterocycloalkyl can contain 3 to 15 carbon atoms (e.g., 3 to 12 or 5 to 10). Examples of a heterocycloalkyl group include, but are not limited to, piperidyl, piperazyl, tetrahydropyranyl, tetrahydrofuryl, 1,4-dioxolanyl, 1,4-dithianyl, 1,3-dioxolanyl, oxazolidyl, isoxazolidyl, morpholinyl, thiomorpholyl, octahydrobenzofuryl, octahydrochromenyl, octahydrothiochromenyl, octahydroindolyl, octahydropyrindinyl, decahydroquinolinyl, octahydrobenzo[b]thiopheneyl, 2-oxa-bicyclo[2.2.2]octyl, 1-aza-bicyclo[2.2.2]octyl, 3-aza-bicyclo[3.2.1]octyl, and 2,6-dioxa-tricyclo[3.3.1.03,7]nonyl. A monocyclic heterocycloalkyl group can be fused with a phenyl moiety such as tetrahydroisoquinoline. When a heterocycloalkyl is preceded by a carbon-number modifier, e.g., $C_{4-8}$, its means the heterocycloalkyl group contains 4 to 8 carbon atoms.

As used herein, the term "hetero," when used alone or as part of a larger moiety (e.g., as in "heterocyclo," "heterocycloalkyl," "heterocycloalkylene" or "heteroaryl"), refers to a hetero atom or group that is —O—, —S—, —NH—, or —C(=O)—.

As used herein, the term "aryl," when used alone or as part of a larger moiety (e.g., as in "arylkyl," or "arylkoxy"), refers to a monocyclic (e.g., phenyl), bicyclic (e.g., indenyl, naphthalenyl, or tetrahydronaphthyl), and tricyclic (e.g., fluorenyl, tetrahydrofluorenyl, tetrahydroanthracenyl, or anthracenyl) ring system in which the monocyclic ring system is aromatic (e.g., phenyl) or at least one of the rings in a bicyclic or tricyclic ring system is aromatic (e.g., phenyl). The bicyclic and tricyclic groups include, but are not limited to, benzo-fused 2- or 3-membered carbocyclic rings. For instance, a benzo-fused group includes phenyl fused with two or more $C_{4-8}$ carbocyclic moieties.

As used herein, the term "heteroaryl" refers to a monocyclic, bicyclic, or tricyclic ring system having 5 to 15 ring atoms wherein at least one of the ring atoms is a heteroatom (e.g., N, O, S, or combinations thereof) and when the monocyclic ring system is aromatic or at least one of the rings in the bicyclic or tricyclic ring systems is aromatic. It can contain 5 to 12 or 8 to 10 ring atoms. A heteroaryl group includes, but is not limited to, a benzo-fused ring system having 2 to 3 rings. For example, a benzo-fused group includes benzo fused with one or two 4- to 8-membered heterocycloalkyl moieties (e.g., indolizyl, indolyl, isoindolyl, 3H-indolyl, indolinyl, benzo[b]furyl, benzo[b]thiophenyl, quinolinyl, or isoquinolinyl). Some examples of heteroaryl are pyridyl, IH-indazolyl, furyl, pyrrolyl, thienyl, thiazolyl, oxazolyl, imidazolyl, tetrazolyl, benzofuryl, isoquinolinyl, benzithiazolyl, xanthenyl, thioxanthenyl, phenothiazinyl, dihydroindolyl, benzo[1,3]dioxolyl, benzo [b] furyl, benzo [bjthiophenyl, indazolyl, benzimidazolyl, benzthiazolyl, puryl, quinolinyl, quinazolinyl, phthalazyl, quinazolyl, quinoxalyl, isoquinolinyl, 4H-quinolizyl, benzo-1, 2,5-thiadiazolyl, and 1,8-naphthyridyl.

As used herein, the term "a ring structure" in the context of a ring formed by a carbon center and its two substituents [e.g., as in R1 and R2 and the same carbon atom to which they are attached in Formula (I); P1 and P2 and the same carbon atom to which they are attached in Formula (II); or $Q_5$ and $Q_6$ and the same carbon atom to which they are attached, $Q_1$ and E and the same carbon atom to which they are attached, $Q_4$ and F and the same carbon atom to which they are attached, in Formula (III)] generally refers to a single ring that can be saturated or unsaturated (e.g., aromatic) and can contain one or more heteroatoms each independently selected being O, S, N, or P. Specifically, the ring structure can be a 3-9 (e.g., 3, 4, 5, 6, or 7) membered cycloalkyl, heterocycloalkyl, aryl, or heteroaryl each of which is optionally substituted at the carbon or hetero ring atom.

As used herein, the term "alkoxyalkyl" refers to alkyl-O-alkyl, and example of which is $C_2H_5$—O—$C_2H_4$—.

As used herein, the suffix "-ene" is used to describe a bivalent group with two radical points for forming two covalent bonds with two other moieties. In other words, any of the terms as defined above can be modified with the suffix "-ene" to describe a bivalent version of that moiety. For example, a bivalent aryl ring structure is "arylene," a bivalent benzene ring structure is "phenylene," a bivalent heteroaryl ring structure is "heteroarylene," a bivalent cycloalkyl ring structure is a "cycloalkylene," a bivalent heterocycloalkyl ring structure is "heterocycloalkylene," a bivalent cycloalkenyl ring structure is "cycloalkenylene," a bivalent alkenyl chain is "alkenylene," and a bivalent alkynyl chain is "alkynylene."

As used herein, the term "optionally" (e.g., as in "optionally substituted with") means that the moiety at issue is either substituted or not substituted, and that the substitution occurs only when chemically feasible. For instance, H cannot be substituted with a substituent and a covalent bond or —C(=O)— group cannot be substituted with a substituent.

As used herein, an "oxo" group refers to =O.

As used herein, a "carbonyl" group refers to —C(O)— or —C(=O)—.

As used herein, the term "substituted," whether preceded by the term "optionally" or not, refers to the replacement of hydrogen radicals in a given structure with the radical of a specified substituent. Specific substituents are described above in the definitions and below in the description of compounds and examples thereof. Unless otherwise indicated, an optionally substituted group can have a substituent at each substitutable position of the group, and when more than one position in any given structure can be substituted with more than one substituent selected from a specified group, the substituent can be either the same or different in every position. A ring substituent, such as a heterocycloalkyl, can be bound to another ring, such as a cycloalkyl, to form a Spiro-bicyclic ring system, e.g., both rings share one common atom. As one of ordinary skill in the art will recognize, combinations of substituents envisioned by this invention are those combinations that result in the formation of stable or chemically feasible compounds.

For convenience and as commonly understood, the term "optionally substituted" only applies to the chemical entities that can be substituted with suitable substituents, not to those that cannot be substituted chemically.

As used herein, the term "or" can mean "or" or "and."

DETAILED DESCRIPTION OF THE INVENTION

Figure 1:
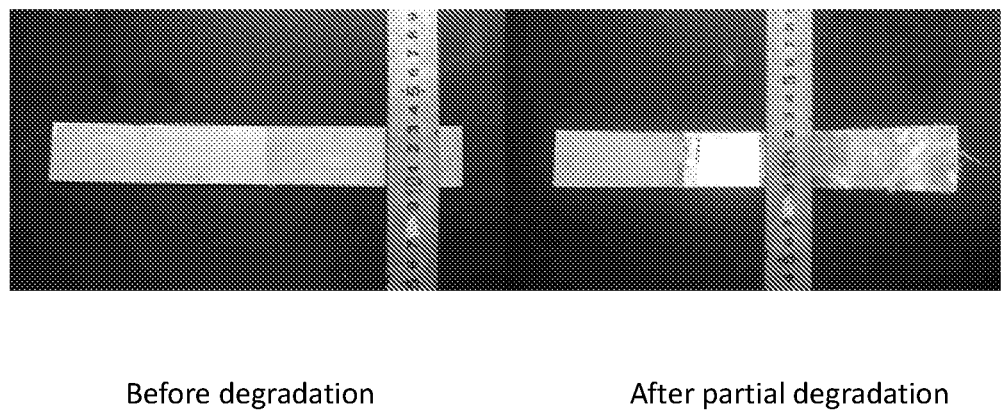
FIG. 1 is a schematic of the partial degradation of a recyclable CCL.

The following description and examples are provided for illustration only, and not intended to be limiting in any aspect.

A degradable epoxy matrix, which is a degradable cross-linked polymer polymerized with a curing agent and an epoxy resin, can also includes an auxiliary material such as fiber glass cloth, glass paper, paper, synthetic fiber to prepare recyclable CCL.

The principle of recovery of CCL in this invention is that: immerse the materials after stripping copper foil from CCL into the hot recycling solution of acid and solvent. Firstly, the epoxy resin matrix is degraded to produce the reinforcements, and finally to recycle the epoxy resin degradation products with alkali neutralization. Under such conditions, the epoxy resin matrix can be degraded for its acid-sensitive crosslinked structure, in which the acetal bond will break resulting in cross-linked structure of epoxy resin matrix to dissolve into the non-crosslinked polymer which is soluble in the organic solvent (e.g., thermoplastic resin). When epoxy resin matrix is fully dissolved, the reinforcements can be removed from the solution. And the solution could be neutralized, precipitated and solid-liquid separated by alkali to obtain the degradable epoxy resin matrix products. Recycled reinforcements and non-crosslinked polymers all can be separated, recovered and reused.

One of the key benefits provided by the present invention is that:

This invention provides that the degradable epoxy resin matrix as raw materials, can prepare the recyclable CCL, which is applied in the preparation of printed circuit boards. Under certain conditions, the printed circuit board can be recycled. Wherein, precious metals, reinforcements and degradation products of epoxy resin matrix can be separated and recovered.

Currently the recovery technology of the epoxy resin matrix in circuit board composite materials is that the reinforcing material must be recovered by burning off the plastic components of composite materials. This invention uses degradable epoxy resin matrix to prepare the CCL, which is used for printed circuit boards, without special conditions, which can be degraded under mild conditions, the copper foil, plastic component and reinforcing materials of printed circuit board can be recycled, and recovery is more efficiently.

The manufacturing process of PCB would undergo chemical etching (acid and alkaline) and other processes. Although degradation occurs under acidic conditions, the degradation phenomenon of the CCL prepared in this invention does not occur in the chemical etching (acid and alkaline) process of PCB. In addition, the degradation and recovery method can process under relatively mild reaction conditions, and be economic, easy to control. The reinforcements and epoxy resin matrix degradation products can be separated and recovered.

The epoxy resin curing products (the degradable cross-linked polymer polymerized by degradable curing agent and epoxy resin systems) could be degraded to polymerize the thermoplastic epoxy resin polymer. And in the degradation process, a small amount of acetal groups has been lost. The mass recovery ratio of thermoplastic epoxy resin polymer is high and it can be processed for industrial use.

This invention presents that the mass recovery ratio of epoxy resin curing products and reinforcing materials is over 96%. Over 95% of reinforcing material (i.e. glass fibre) of circuit board composite material can be recycled. The original texture and mechanical property of reinforcing materials could be retained. The recycling reinforcing materials is of stable quality, clean surface, and no defect under the acid recycling conditions and can be reused in the new composite materials. The degradable products of recycling epoxy resin polymer could be used for the plastic products through the chemical process.

The following examples illustrate the prevention invention. They are not intended to limit the scope of the present invention as claimed herein.

Example 1: Preparation of Degradable Bromine-Containing Flame Resistance FR-4 CCL Samples (1) Preparation for Curing Agent A:

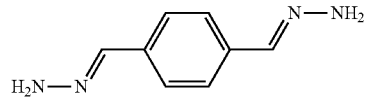

A 1,4-phthalaldehyde solution was first prepared by dissolved 13.4 g 1,4-phthalaldehyde in 370 g ethanol. Separately, 20 g ethanol and 14.7 g 85% hydrazine hydrate were placed in a reaction flask to give a mixture. The 1,4-phthalaldehyde solution was added dropwise over an hour to the mixture while stirring at the room temperature. The solution was stirring at room temperature for 5-6 hours and then filtered to give a filtration cake which was washed with ethanol and dried to give 13.9 g yellow solid which has a melting point of 158-166° C.

$^1$H-NMR (400 MHz, d$^6$-DMSO): 7.67 (s, 2H), 7.42 (s, 4H), 6.76 (s, 4H).

(2) Preparation of Degradable Epoxy Resin Adhesive:

40 g bisphenol A-type liquid epoxy resin E54 (EEW 0.53~0.54 eq/100 g), 28 g bisphenol A-type solid epoxy resin E21 (EEW 0.20~0.22 eq./100 g), 132 g low-bromine epoxy resin (content of Br about 20%, EEW 0.23~0.24 eq./100 g), and 23.62 g curing agent A (AEW 2.47 N—H eq./100 g) were dissolved in an appropriate amount of DMF, and mixed uniformly. Then 0.75 g silane coupling agent KH560 and 74.5 g SiO$_2$ powder (D50 5~10 μm) were added to the mixture. The mixture was stirred for 30 minutes using a high speed dispersing machine to obtain an adhesive with solid content (S/C) of 60%. The gel time S/G of the adhesive at 171° C. was 300~350 sec.

(3) Preparation of Resin Prepreg:

7628 Fibre Glass Cloth or Fabric is a lightweight continuous filament fabric commonly used for laminating or encapsulating insulation wool & fibres (slabs, blankets with & without wire netting) in the industrial & marine sector. A piece of 7628 Glass Cloth was impregnated with the adhesive prepared above in Step (2) and then baked in an oven at 150° C. for 10 minutes, to give the resin prepreg of which resin content R/C was about 45%. The gel time P/G of the prepreg resin at 171° C. was 150~170 seconds.

(4) Preparation of CCL:

5 pieces of prepared resin prepreg above were overlapped together, and both sides were covered with copper foil (1 Oz HTE copper foil) before they were put in a hot pressing machine to press at 170° C. for 60 minutes. After cooling naturally, a CCL was obtained with a thickness of about 1.0 mm. The CCL's performance was tested by the method shown in Table 1, and the main performance of the CCL obtained in this example was as shown in Table 2. All the performance of the CCL sample in tables met the IPC4101/126 requirements and the operating requirements of general FR-4 CCL.

Example 2: Preparation of Degradable Bromine-Containing Flame-Resistant FR-4 CCL Samples (1) Preparation for Curing Agent B

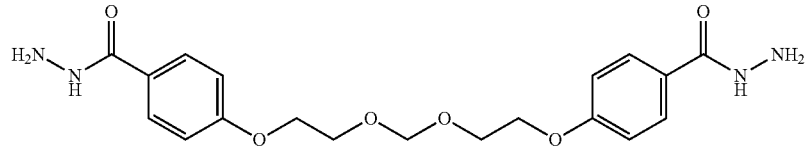 [SMILES: NNC(=O)c1ccc(OCCOCOCCOc2ccc(C(=O)NN)cc2)cc1]

Step 1: 800 g 2-chloroethanol, 164 g paraformaldehyde, 4.8 g p-toluenesulfonic acid, and 346 g toluene were added successively into a 2 L reaction flask. The mixture was heated under reflux to undergo a reaction for 6 hours. After the reaction was completed, toluene was removed and recovered under a reduced pressure, the reaction residue was distilled under a reduced pressure. The fraction at 71~72° C./70 Pa was collected to obtain 739 g bis-(2-chloroethoxy) methane.

Step 2: First, 2200 g DMF was added to a 10 L reaction flask. Then, 569 g of bis-(2-chloroethoxy) methane, 1000 g of methyl paraben, and 300 g of sodium hydroxide were added under stirring to the DMF and the resultant solution was heated under reflux to undergo a reaction for 16 hours. After the reaction was completed, the solution was cooled to 60° C. and DMF was removed and recovered. A white solid was precipitated after adding water into the residue, and dried to give 960 g intermediate.

Step 3: 3600 g of ethanol, 960 g of the intermediate prepared above in Step 2, and 900 g of 85% hydrazine hydrate were successively added into a 10 L reaction flask, then the mixture was heated under reflux to undergo a reaction for 16 hours. After the reaction was completed, the solution cooled down and a crystal was precipitated. The solution was filtered off and the crystalline remaining was recrystallized from ethanol to give 389 g curing agent B.

$^1$H-NMR (400 MHz, d$^6$-DMSO): 9.63 (s, 2H), 7.79 (d, 4H), 6.98 (d, 4H), 4.76 (s, 2H), 4.45 (s, 4H), 4.17 (t, 4H), 3.84 (t, 4H). LC/MS (M+H$^+$): 405.

(2) Preparation of Degradable Epoxy Resin Adhesive 40 g bisphenol A-type liquid epoxy resin E54 (EEW 0.53~0.54 eq/100 g), 28 g bisphenol A-type solid epoxy resin E21 (EEW 0.20~0.22 eq./100 g), 132 g of low-bromine epoxy resin (with a bromine content of about 20%, EEW 0.23~0.24 eq./100 g), 58.92 g of curing agent B (AEW 0.99 N—H eq./100 g) were uniformly dissolved in an appropriate amount of methyl ethyl ketone. Then 0.86 g of silane coupling agent KH560 and 86.3 g SiO$_2$ powder (D50: 5~10 μm) were added. The mixture was stirred using a high speed dispersing machine for 30 minutes to obtain an adhesive which solid content S/C was 60%. The gel time S/G of adhesive 171° C. was 280~320 sec.

(3) Preparation of Resin Prepreg 7628 glass cloth was impregnated with the adhesive obtained in Step (2), then baked in an oven at 150° C. for 10 minutes, to give a prepreg which had a resin content R/C of about 45%. The gel time P/G of the prepreg resin powder 171° C. was 140~160 sec.

(4) Preparation of CCL 5 pieces of prepared resin prepreg above were overlapped, and both sides were covered with copper foil (1 Oz HTE copper foil) before they were put into a hot pressing machine to press at 170° C. for 60 minutes. After cooling naturally, a CCL with a 1.0 mm thickness was obtained. The performance test method of CCL was as shown in Table 1, the main performance of CCL obtained in this example was as shown in Table 2. All the performance of the CCL sample in tables met IPC4101/126 requirements and the operating requirements of general FR-4 CCL.

Example 3: Preparation of Degradable Bromine-Containing Flame-Resistant FR-4 CCL (1) Preparation for Curing Agent C

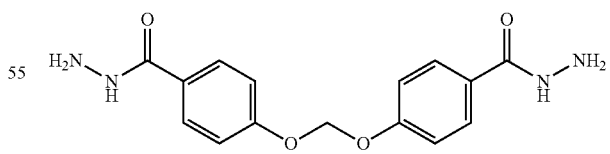

10 g Methylparaben, 6.8 g dibromomethane and 3.9 g sodium hydroxide were dissolved in 25 mL of N,N-dimethylformamide (DMF) in a 250 mL three-neck round bottom flask equipped with a condenser. The solution was heated to reflux for 5 hours and then cooled to the room temperature. The mother liquid (reaction mixture) was concentrated before water was added to result in a precipitate which was filtered and dried to afford 3 g of a solid intermediate.

The solid intermediate was dissolved in 10 mL ethanol in a 250 mL three-neck round bottom flask equipped with a condenser, then 1.4 g hydrazine hydrate was added to the ethanol solution. The resultant mixture was heated to 78° C. for reaction under reflux for 2 hours, then cooled to below 5° C. to result in a solid precipitate. The solid precipitate was filtered and washed with ethanol to give 1.5 g white solid product which had a melting point of 248-249° C.

$^1$H-NMR (400 MHz, d6-DMSO): 9.66 (s, 2H), 7.81 (d, 4H), 7.14 (d, 4H), 5.96 (s, 2H), 4.45 (s, 4H). LC/MS (M+H$^+$): 317.

(2) Preparation of Degradable Epoxy Resin Adhesive:

40 g bisphenol A-type liquid epoxy resin E54 (EEW 0.53~0.54 eq/100 g), 28 g bisphenol A-type solid epoxy resin E21 (EEW 0.20~0.22 eq./100 g), 132 g low-bromine epoxy resin (containing about 20% bromine, EEW 0.23~0.24 eq./100 g), and 46.15 g curing agent C (AEW 1.26 N—H eq./100 g) were dissolved in an appropriate amount of N-methylpyrrolidone, and mixed uniformly. Then 0.82 g silane coupling agent KH560, 82.0 g SiO$_2$ powder (D50 5~10 μm) and 4.92 g curing accelerator were added. The resultant mixture was stirred for 30 minutes using a high speed dispersing machine, to obtain an adhesive in which solid content S/C was 60%. The gel time S/G of adhesive at 171° C. was 260~300 sec.

(3) Preparation of Resin Prepreg:

A piece of 7628 glass cloth was impregnated with the above formulated adhesive, then baked in an oven at 150° C. for 10 minutes to give a prepreg in which resin content R/C was about 45%. The gel time P/G of the prepreg resin powder at 171° C. was 130~150 seconds.

(4) Preparation of CCL:

5 pieces of the resin prepreg described above were overlapping together. After both sides were covered with copper foil (1 Oz HTE copper foil), the resin prepreg was put in a hot pressing machine to press at 170° C. for 60 minutes. After cooling naturally, the CCL which thickness was about 1.0 mm is obtained. The performance test method of CCL was as shown in Table 1, the main performance data of the CCL obtained in this example was shown in Table 2. All the performance of the CCL sample in tables met the IPC4101/126 requirements and the operating requirements of general FR-4 CCL.

Example 4: Preparation of Degradable Bromine-Containing Flame Resistance FR-4 CCL Samples (1) Preparation of Degradable Epoxy Resin Adhesive:

40 g bisphenol A-type liquid epoxy resin E54 (EEW 0.53~0.54 eq/100 g.), 10 g trifunctional epoxy resin XY636 (EEW 0.69~0.71 eq./100 g), 70 g low-bromine epoxy resin (with the bromine content of about 20%, EEW 0.23~0.24 eq./100 g), 80 g isocyanate-modified epoxy (EEW 0.34~0.40 eq./100 g), 46.15 g curing agent B (AEW 0.99 N—H eq./100 g) were dissolved in an appropriate amount of acetone and mixed uniformly. Then 0.92 g silane coupling agent KH560 and 91.7 g SiO$_2$ powder (D50 5~10 μm) and 33 g tetrabromobisphenol A as a flame retardant were added to the solution. The resultant mixture was stirred for 30 minutes using a high speed dispersing machine, to obtain an adhesive which had a solid content S/C of 60%. The gel time S/G of the adhesive at 171° C. was 280~320 seconds.

(2) Preparation of Resin Prepreg:

A piece of 7628 glass cloth was first impregnated with the adhesive prepared in step (1) above, and then baked for in an oven at 150° C. for 10 minutes to give a prepreg which had a resin content R/C of about 45%. The gel time P/G of the prepreg resin powder at 171° C. was 140~160 seconds.

(3) Preparation of CCL:

5 pieces of the resin prepreg prepared in step (2) above were first overlapped, and both sides were then covered with copper foil (1 Oz HTE copper foil). They were then put in a hot pressing machine to press for at 190° C. for 60 minter. After cooling naturally, the CCL with a thickness of about 1.0 mm was obtained. The performance test method of the CCL was as shown in Table 1, the main performance data of CCL obtained in this example was as shown in Table 2. All the performance of the CCL sample in tables met the IPC4101/128 requirements and the operating requirements of general Hi-Tg FR-4 CCL.

Example 5: Preparation of Degradable Bromine-Containing Flame Resistance FR-4 CCL Samples (1) Preparation of Degradable Epoxy Resin Adhesive:

40 g bisphenol A-type liquid epoxy resin E54 (EEW 0.53~0.54 eq/100 g.), 10 g trifunctional epoxy resin XY636 (EEW 0.69~0.71 eq./100 g), 70 g low-bromine epoxy resin (with the bromine content of about 20%, EEW 0.23~0.24 eq./100 g), 80 g isocyanate-modified epoxy (EEW 0.34~0.40 eq./100 g), 58.9 g curing agent C (AEW 1.26 N—H eq./100 g) were dissolved in an appropriate amount of DMF and mixed uniformly. Then 0.86 g silane coupling agent KH560, 86.3 g SiO$_2$ powder (D50 5~10 μm), 31 g tetrabromobisphenol A as a flame retardant, and 5.17 g curing agent UR-200 were added to the solution. The resultant mixture was stirred for 30 minutes using a high speed dispersing machine to obtain an adhesive with a solid content S/C of 60%. The gel time S/G of this adhesive at 171° C. was 300~340 sec.

(2) Preparation of Resin Prepreg:

A piece of 7628 glass cloth was impregnated with the adhesive prepared in step (1) above, then baked in an oven at 150° C. for 10 minutes to give the prepreg which resin content R/C was about 45%. The gel time P/G of the prepreg resin powder 171° C. was 150~170 sec.

(3) Preparation of CCL:

5 pieces of resin prepreg prepared above in step (2) above were overlapping with each other, and both sides were covered with copper foil (1 Oz HTE copper foil) before being put in a hot pressing machine to press at 190° C. for 60 minutes. After cooling naturally, a CCL with a thickness of about 1.0 mm was obtained. The performance test method of CCL was shown in Table 1, and the main performance of CCL obtained in this example was as shown in Table 2. All the performance of the CCL sample in tables met the IPC4101/128 requirements and the operating requirements of general Hi-Tg FR-4 CCL.

Example 6: Preparation of Degradable Halogen-Free Flame Resistance FR-4 CCL Samples (1) Preparation of Degradable Epoxy Resin Adhesive:

70 g bisphenol A-type liquid epoxy resin E54 (EEW 0.53~0.54 eq/100 g), 50 g bisphenol A-type solid epoxy resin E21 (EEW 0.20~0.22 eq./100 g), 80 g phosphorus-containing epoxy resin (having a phosphor content of about 2.5%, EEW 0.22~0.24 eq./100 g), 26.78 g curing agent A (AEW 2.47 N—H eq./100 g) were dissolved in an appropriate amount of xylene and mixed uniformly. Then 0.76 g silane coupling agent KH560 and 75.6 g SiO$_2$ powder (D50 5~10 μm) were added to the solution. The resultant mixture was stirred for 30 minutes using a high speed dispersing machine, to obtain an adhesive which had a solid content S/C of 60%. The gel time S/G of the adhesive at 171° C. was 300~340 seconds.

(2) Preparation of Resin Prepreg:

A piece of 7628 glass cloth was impregnated with the above formulated adhesive, then baked for 10 min in the oven at 150° C., to give the prepreg which resin content R/C was about 45%. The gel time P/G of the prepreg resin powder at 171° C. was 150~170 seconds.

(3) Preparation of CCL:

5 pieces of the resin prepreg prepared in step (2) above were overlapping together, and both sides were covered with copper foil (1 Oz HTE copper foil) before being put in a hot pressing machine to press for 60 min at 170° C. After cooling naturally, the CCL with a thickness of about 1.0 mm was obtained. The performance test method of CCL was as shown in Table 1, the main performance of CCL obtained in this example was as shown in Table 3. All the performance of the CCL sample in tables met the IPC4101/126 requirements and the operating requirements of halogen-free flame resistance FR-4 CCL.

Example 7: Preparation of Degradable Halogen-Free Flame Resistance FR-4 CCL Samples (1) Preparation of Degradable Epoxy Resin Adhesive:

20 g bisphenol A-type liquid epoxy resin E54 (EEW 0.53~0.54 eq/100 g), 10 g trifunctional epoxy resin XY636 (EEW 0.69~0.71 eq./100 g), 80 g isocyanate-modified epoxy (EEW 0.34~0.40 eq./100 g), 90 g phosphorus-containing epoxy resin (with the phosphorus content of about 2.5%, EEW 0.22~0.24 eq./100 g), 83.4 g curing agent B (AEW 0.99 N—H eq./100 g) were dissolved in an appropriate amount of toluene and mixed uniformly. Then 0.94 g silane coupling agent KH560, 94.4 g $SiO_2$ powder (D50 5~10 μm), and 22.6 g phosphonitrile flame retardant was added to the solution. The resultant mixture was stirred for 30 minutes using a high speed dispersing machine to obtain an adhesive which had a solid content S/C of 60%. The gel time S/G of this adhesive at 171° C. was 260~300 seconds.

(2) Preparation of Resin Prepreg:

A piece of 7628 glass cloth was impregnated with the adhesive prepared in step (1) above and then baked for 10 minutes in an oven at 150° C. to give a prepreg which had a resin content R/C of about 45%. The gel time P/G of the prepreg resin powder at 171° C. was 130~150 seconds.

(3) Preparation of CCL:

5 pieces of prepared resin prepreg prepared in step (2) above were overlapped and then both sides were covered with copper foil (1 Oz HTE copper foil). They were then put it in a hot pressing machine to press for 60 minutes at 190° C. After cooling naturally, the CCL with a thickness of about 1.0 mm was obtained. The performance test method of CCL was as shown in Table 1, and the main performance of CCL obtained in this example was as shown in Table 3. All the performance of the CCL sample in tables met IPC4101/128 requirements and the operating requirements of halogen-free flame resistance FR-4 CCL.

Example 8: Preparation of Degradable Halogen-Free Flame Resistance FR-4 CCL Samples (1) Preparation of Degradable Epoxy Resin Adhesive:

20 g bisphenol A-type liquid epoxy resin E54 (EEW 0.53~0.54 eq./100 g), 10 g trifunctional epoxy resin XY636 (EEW 0.69~0.71 eq./100 g), 80 g isocyanate-modified epoxy (EEW 0.34~0.40 eq./100 g), 90 g phosphorus-containing epoxy resin (content of P is about 2.5%, EEW 0.22~0.24 eq./100 g), and 65.3 g curing agent C (AEW 1.26 N—H eq./100 g) were dissolved in an appropriate amount of methyl ethyl ketone and mixed uniformly. Then 0.88 g silane coupling agent KH560, 88.4 g $SiO_2$ powder (D50 5~10 μm), 21.6 g phosphonitrile flame retardant and 5.30 g curing accelerator UR-200 were added to the solution. The resultant mixture was stirred for 30 minutes using a high speed dispersing machine to obtain an adhesive which had a solid content S/C of 60%. The gel time S/G of adhesive at 171° C. was 280~320 seconds.

(2) Preparation of Resin Prepreg:

A piece of 7628 glass cloth was impregnated with the above formulated adhesive, then baked for 10 minutes in an oven at 150° C. to give the prepreg which had a resin content R/C of about 45%. The gel time P/G of the prepreg resin powder at 171° C. was 140~160 seconds.

(3) Preparation of CCL:

5 pieces of the resin prepreg prepared in step (2) above were overlapped and both sides were covered with copper foil (1 Oz HTE copper foil) before they were put in a hot pressing machine to press for 60 min at 190° C. After cooling naturally, the CCL with a thickness of about 1.0 mm was obtained. The performance test method of CCL was as shown in Table 1, and the main performance of CCL obtained in this example was as shown in Table 3. All the performance of the CCL sample in tables met the IPC4101/128 requirements and the operating requirements of halogen-free flame-resistant FR-4 CCL.

Example 9: Preparation of Degradable Halogen-Free Flame Resistance FR-4 CCL Samples (1) Preparation of Degradable Epoxy Resin Adhesive:

40 g bisphenol A-type liquid epoxy resin E54 (EEW 0.53~0.54 eq/100 g.), 80 g isocyanate-modified epoxy (EEW 0.34~0.40 eq./100 g), 80 g phosphorus-containing epoxy resin (with a phosphor content of about 2.5%, EEW 0.22~0.24 eq./100 g), and 65.9 g curing agent B (AEW 0.99 N—H eq./100 g) were dissolved in an appropriate amount of DMF and mixed uniformly. Then 0.90 g silane coupling agent KH560 and 90.0 g $SiO_2$ powder (D50 5~10 μm) were added to the solution. The resultant mixture was stirred for 30 minutes using a high speed dispersing machine, to obtain an adhesive with a solid content S/C of about 60%. The gel time S/G of adhesive at 171° C. was 300~340 seconds.

(2) Preparation of Resin Prepreg:

A piece of 7628 glass cloth was first impregnated with the adhesive prepared in step (1) above and then baked for 10 min in the oven at 150° C., to give the prepreg which resin content R/C was about 45%. The gel time P/G of the prepreg resin powder 171° C. was 150~170 sec.

(3) Preparation of CCL:

5 pieces of the resin prepreg prepared in step (2) above were overlapping together and both sides were then covered with copper foil (1 Oz HTE copper foil). They were then put it in a hot pressing machine to press for 60 minutes at 180° C. After natural cooling, the CCL which thickness was about 1.0 mm is obtained. The performance test method of CCL was as shown in Table 1, the main performance of CCL obtained in this example was as shown in Table 3. All performance of the CCL sample in tables met the IPC4101/128 requirements and the operating requirements of halogen-free flame-resistant FR-4 CCL.

Example 10: Preparation of Degradable Halogen-Free Flame Resistance FR-4 CCL Samples (1) Preparation of Degradable Epoxy Resin Adhesive:

40 g bisphenol A-type liquid epoxy resin E54 (EEW 0.53~0.54 eq./100 g.), 80 g isocyanate-modified epoxy (EEW 0.34~0.40 eq./100 g), 80 g phosphorus-containing epoxy resin (content of P is about 2.5%, EEW 0.22~0.24 eq./100 g) and 54.7 g curing agent C (AEW 1.26 N—H eq./100 g) were dissolved in 20 g trimethylolpropane triglycidyl ether (EEW 0.68~0.74 eq./100 g), heated at 70° C., and mixed uniformly. Then 0.85 g silane coupling agent KH560, 84.9 g $SiO_2$ powder (D50 5~10 μm), and 5.09 g curing accelerator UR-200 were added to the solution. The resultant mixture was stirred for 30 minutes using a high speed dispersing machine to obtain an adhesive. The gel time S/G of the adhesive at 171° C. was 280~320 seconds.

(2) Preparation of Resin Prepreg:

A piece of 7628 glass cloth was impregnated with the adhesive prepared in step (1) above at 70° C. and then baked for 10 minutes in an oven at 150° C. to give a prepreg with the resin content R/C of about 45%. The gel time P/G of the prepreg resin powder at 171° C. was 140~160 seconds.

(3) Preparation of CCL:

5 pieces of the resin prepreg prepared above in step (2) were overlapped together and both sides were covered with copper foil (1 Oz HTE copper foil) before they were put in a hot pressing machine to press for 60 minutes at 180° C. After cooling naturally, the CCL with a thickness of about 1.0 mm was obtained. The performance test method of CCL was as shown in Table 1, the main performance of CCL obtained in this example was as shown in Table 3. All the performance of the CCL sample in tables met the IPC4101/128 requirements and the operating requirements of halogen-free flame-resistant FR-4 CCL.

TABLE 1

| Order | Test item | Test method | unit | IPC4101/126 standard | Test result |
|---|---|---|---|---|---|
| 1 | Tin Immersion | 288° C. * 10 sec/5 pcs 3" * 3" | / | Tested more than 5 times -- No separation and no bubbles. | More than 10 times -- No separation, no bubbles |
| 2 | Peel strength | After thermal stress | N/mm | ≥1.05 | 1.35 |
| 3 | Tg | DSC | ° C. | ≥130 | 132.23/137.73 |
| 4 | Td 5% | TGA | ° C. | / | 307.15 |
| 5 | Dk (1 MHz) | C-24/23/50 | / | ≤5.4 | 4.8 |
| 6 | Df (1 MHz) | | / | ≤0.035 | 0.018 |
| 7 | PCT | 103 KPa * 3 h/288° C. * 10 sec | / | No separation, no bubbles, no white spot | No separation, no bubbles, no white spot |
| 8 | Water absorption | D-24/23 | % | ≤0.35 | 0.18 |
| 11 | T-260 | TMA | min | / | 15 |
| 12 | Fire resistance | UL94 | / | V-0 | V-0 |
| 13 | Surface resistivity | E-24/125 | MΩ/m | ≥$10^3$ | $5.5 \times 10^6$ |
| 14 | Volume resistivity | | MΩ | ≥$10^3$ | $4.5 \times 10^6$ |
| 15 | Bending strength | warp | MPa | ≥415 | 550 |
| | | weft | A | ≥345 | 450 |

TABLE 2

| Order | Example 1 | Example 2 | Example 3 | Example 4 | Example 5 |
|---|---|---|---|---|---|
| 1 | More than 10 times -- No separation, no bubbles | More than 10 times -- No separation, no bubbles | More than 10 times -- No separation, no bubbles | More than 30 times -- No separation, no bubbles | More than 30 times -- No separation, no bubbles |
| 2 | 1.35 | 1.35 | 1.41 | 1.41 | 1.55 |
| 3 | 132.23/137.73 | 143.55/147.33 | 142.64/146.57 | 173.65/177.78 | 175.78/178.34 |
| 4 | 307.15 | 315.67 | 320.04 | 385.94 | 390.15 |
| 5 | 4.8 | 4.7 | 4.8 | 4.4 | 4.4 |
| 6 | 0.018 | 0.017 | 0.017 | 0.010 | 0.011 |
| 7 | No separation, no bubbles, no white spot | No separation, no bubbles, no white spot | No separation, no bubbles, no white spot | No separation, no bubbles, no white spot | No separation, no bubbles, no white spot |
| 8 | 0.18 | 0.16 | 0.15 | 0.11 | 0.11 |
| 11 | 15 | 20 | 23 | 60 | 60 |
| 12 | V-0 | V-0 | V-0 | V-0 | V-0 |
| 13 | $5.5 \times 10^6$ | $5.6 \times 10^6$ | $5.6 \times 10^6$ | | |
| 14 | $4.5 \times 10^6$ | $4.4 \times 10^6$ | $4.4 \times 10^6$ | | |

TABLE 2-continued

| Order | Example 1 | Example 2 | Example 3 | Example 4 | Example 5 |
|---|---|---|---|---|---|
| 15 | 550<br>450 | 560<br>450 | 560<br>450 | | |

TABLE 3

| Order | Example 6 | Example 7 | Example 8 | Example 9 | Example 10 |
|---|---|---|---|---|---|
| 1 | More than 10 times -- No separation, no bubbles | More than 30 times -- No separation, no bubbles | More than 30 times -- No separation, no bubbles | More than 30 times -- No separation, no bubbles | More than 30 times -- No separation, no bubbles |
| 2 | 1.47 | 1.55 | 1.58 | 1.47 | 1.53 |
| 3 | 138.55/141.61 | 175.86/178.35 | 177.49/179.12 | 154.35/155.06 | 155.67/157.45 |
| 4 | 325.16 | 390.23 | 395.66 | 387.24 | 392.15 |
| 5 | 4.8 | 4.5 | 4.5 | 4.7 | 4.6 |
| 6 | 0.019 | 0.012 | 0.011 | 0.013 | 0.012 |
| 7 | No separation, no bubbles, no white spot | No separation, no bubbles, no white spot | No separation, no bubbles, no white spot | No separation, no bubbles, no white spot | No separation, no bubbles, no white spot |
| 8 | 0.17 | 0.19 | 0.17 | 0.17 | 0.17 |
| 11 | 20 | 60 | 60 | 60 | 60 |
| 12 | V-0 | V-0 | V-0 | V-0 | V-0 |

Example 11: Preparation of Glass Fiber Curing Piece (1) Preparation of Degradable Epoxy Resin Adhesive:

40 g bisphenol A-type liquid epoxy resin E54 (EEW 0.53~0.54 eq./100 g), 80 g isocyanate-modified epoxy (EEW 0.34~0.40 eq./100 g), 80 g phosphorus-containing epoxy resin (content of P is about 2.5%, EEW 0.22~0.24 eq./100 g), and 54.7 g curing agent C (AEW 1.26 N—H eq./100 g) were dissolved in an appropriate amount of DMF and mixed uniformly. Then 0.85 g silane coupling agent KH560, 84.9 g $SiO_2$ powder (D50 5~10 μm), and 5.09 g curing accelerator were added to the solution. The resultant mixture was stirred for 30 minutes using a high speed dispersing machine, to obtain an adhesive with a solid content S/C of 60%. The gel time S/G of the adhesive at 171° C. was 280~320 seconds.

(2) Preparation of Resin Prepreg:

A piece of 7628 glass cloth was impregnated with the adhesive prepared in step (1) above and then baked for 10 minutes in an oven at 150° C. to give a prepreg which had the resin content R/C of about 45%. The gel time P/G of the prepreg resin powder at 171° C. was 140~160 seconds.

(3) Preparation of Glass Fiber Curing Piece:

5 pieces of prepared resin prepreg were overlapped together to be superimposed and placed into a hot pressing machine to press for 60 minutes at 180° C. After cooling naturally, the glass fiber curing piece was obtained.

Example 12: Degradation of CCL 1 g CCL samples from Example 1, 5 mL concentrated hydrochloric acid, and 95 mL ethylene glycol were placed in a 250 mL three-neck flask, stirred and heated to 160° C. for 6 hours, cooled to 100° C., filtered when the solution was hot. The CCL degraded into copper foil and glass fiber. The degradation solution was separated and then neutralized with a 5% sodium hydroxide solution to produce a solid precipitate. The precipitate was filtered, washed with water, and then dried to give 0.96 g of degradation products of thermoset epoxy resin, copper foil and glass fiber. The mass recovery ratio was 96%.

Example 13: Degradation of CCL 1 g CCL samples from Example 1, 10 mL concentrated hydrochloric acid and 90 mL ethylene glycol were placed in a 250 mL three-neck flask, stirred and heated to 160° C., cooled to 100° C. after 6 hours, filtered while the solution was hot. The CCL degraded into copper foil and glass fiber. The degradation solution was separated and then neutralized with 10% sodium hydroxide solution and precipitated solid was filtered, then the solid was washed with water and dried to give 0.95 g of degradation products of thermoset epoxy resin, copper foil and glass fiber. The mass recovery ratio was 95%.

Example 14: Degradation of CCL 1 g CCL sample from Example 2, 5 mL concentrated hydrochloric acid and 95 mL ethylene glycol were placed in a 250 mL three-neck flask, stirred and heated to 140° C. for 4 hours, cooled to 100° C., filtered while the solution was hot. The CCL degraded into copper foil and glass fiber. The degradation solution was separated and then neutralized with a 5% sodium hydroxide solution to produce a solid precipitate. The precipitate was filtered, washed with water, and then dried to give 0.95 g of degradation products of thermoset epoxy resin, copper foil and glass fiber. The mass recovery ratio was 95%.

Example 15: Degradation of CCL 1 g CCL samples in example 2, 5 mL concentrated hydrochloric acid and 95 mL octanol were placed in a 250 mL three-neck flask, stirred and heated to 155° C. for 4 hours, cooled to 100° C. after 4 hours, filtered when the solution was hot. The CCL degraded into copper foil and glass fiber. The degradation solution was separated and then neutralized with a 5% sodium hydroxide solution to produce a solid precipitate. The precipitate was filtered, washed with water, and then dried to give 0.96 g of degradation products of thermoset epoxy resin, copper foil and glass fiber. The mass recovery ratio was 96%.

Example 16: Degradation of CCL 1 g CCL samples from Example 3, 5 mL concentrated hydrochloric acid and 95 mL heptanol were placed in a 250 mL three-neck flask, stirred and heated to 155° C. for 4 hours, cooled to 100° C., and filtered when the solution was hot. The CCL degraded into copper foil and glass fiber. The degradation solution was separated and then neutralized with a 20% sodium hydroxide solution to produce a solid precipitate. Copper foil, glass fiber and degradation solution were separated. The degradation solution was neutralized with 20% sodium hydroxide solution and precipitated solid was filtered and the solid was washed with water and dried to give 0.95 g of degradation products of thermoset epoxy resin, copper foil and glass fiber. The mass recovery ratio was 95%.

Example 17: Degradation of CCL 1 g CCL samples from Example 3, 5 mL concentrated hydrochloric acid and 95 mL ethylene glycol were placed in a 250 mL three-neck flask, stirred and heated to 160° C. for 4 hours, cooled to 100° C., filtered while the solution was still hot. Copper foil, glass fiber and degradation solution were separated. The degradation solution was neutralized with 20% sodium hydroxide solution and precipitated solid was filtered and the solid was first washed with water and then dried to give 0.95 g of degradation products of thermoset epoxy resin, copper foil and glass fiber. The mass recovery ratio was 95%.

Example 18: Degradation of the Glass Fiber Curing Piece 1 g glass fiber curing piece in example 11, 5 mL concentrated hydrochloric acid and 95 mL ethylene glycol were placed in a 250 mL three-neck flask, stirred and heated to 160° C., cooled to 100° C. after 3 hours, filtered when the solution was hot. Glass fiber and degradation solution were separated. The degradation solution was neutralized with 20% sodium hydroxide solution and precipitated solid was filtered and the solid was washed with water and dried to give 0.95 g of degradation products of thermoset epoxy resin and glass fiber. The mass recovery ratio was 95%.

Example 19: Demonstration of the CCL Partially Degradation

The CCL sample from Example 3, 10 mL concentrated hydrochloric acid and 90 mL ethylene glycol were placed in a 500 mL beaker, stirred and heated to 145° C. After 1 hour, the copper foil was separated partially, white glass fiber cloth was visible, the schematic view of partial degradation was shown in FIG. 1.

Example 20: Acidic Etching Waste of the CCL Sample

The CCL sample in example 9, 100 mL acidic copper chloride etching liquid were placed in a 500 mL beaker, heated to 50° C. After 5 minutes, the etching of copper was completed. After the sample washed with water and dried, the substrate of CCL was found smooth, no copper scrap remained.

Example 21: Alkaline Etching Waste of CCL Sample

The CCL sample in example 9, 100 mL alkaline copper chloride etching liquid were placed in a 500 mL beaker and then heated to 50° C. After 5 minutes, the etching of copper was completed. After the sample washed with water and dried, the substrate of CCL was found smooth, no copper scrap remained.

Example 22: Preparation of 4-Layer PCB Board Sample

Step (1):
A piece of 7628 glass cloth was impregnated with the degradable epoxy resin adhesive according to step (1) from example 9, then baked for 10 min in the oven at 150° C., to give the prepreg which resin content R/C was about 43%. The gel time P/G of the prepreg resin powder at 171° C. was 150~170 sec.

Step (2)
7 pieces of the prepreg resin prepared in step (1) above were overlapped together, and both sides were covered with copper foil (1 Oz HTE copper foil), then put in a hot pressing machine to press for 60 minutes at 180° C. After cooling naturally, the CCL with a thickness 1.3 mm is obtained.

Step (3)
A piece of 1080 glass cloth was impregnated with the degradable epoxy resin adhesive according to step (1) in example 9, then baked for 10 min in an oven at 150° C., to give the prepreg which resin content R/C was about 64%. The gel time P/G of the prepreg resin powder 171° C. was 150~170 sec.

Figure 2:
FIG. 2 is a schematic of the 4-layer PCB board sample prepared in Example 22.

Step (4):
The CCL samples prepared in step (2) and the prepreg obtained in step (3) was cut into a size of 416 mm*518 mm, and sent to a PCB production line to process into four-layer PCB board, combining with FIG. 2, the specific processing steps were as follows:

(a) The cutted CCL samples used the inner dry film method through the inner lining film, exposure development, the inner layer etching (acid etching process) and back film and other technologies to obtain inner circuit pattern;

(b) The sample of the prepared graphics circuit boards underwent brown oxidation, and superimposed on the prepreg and a copper foil according to the laminated structure, then pressed with the vacuum hot pressing machine for 60 min at 2.5 MPa and 180° C. to give a four-layer board which thickness is 1.5 mm;

(c) The four-layer board was mechanically drilled, after drilling residual cured epoxy resin was oxidated and removed by potassium permanganate in the NaOH solution, the through-hole wall became smooth and clean, then was metallized by copper plating;

(d) The above four-layer board processed outer dry film using normal method, and then pattern plating, plating on copper and tin, and then using the alkaline etching to back the film, and then obtained the outer graphic line by tin stripping; and (E) The circuit-completed four-layer board sample through solder resist, characters, milling shape, test and chemical immersion tin to give 4-layer PCB board sample.

What is claimed is:

1. A recyclable copper clad laminate (CCL) for a printed circuit board comprising:

copper foil and a recyclable fiber prepreg;

the recyclable copper clad laminate, being a double or multi-layer panel, is overlapped and prepared from the recyclable fiber prepreg and the copper foil;

the recyclable fiber prepreg including a degradable epoxy resin composition, the degradable epoxy resin composition including a degradable curing agent, epoxy resin, and an auxiliary material, the degradable curing agent comprises one or more of degradable curing agents having the molecular structural formula as shown below:

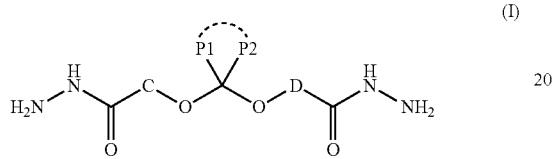

(I)

wherein each of P1 and P2, independently, is hydrogen, alkyl, cycloalkyl, heterocyclic, heterocycloalkyl, alkenyl, cycloalkenyl, aryl, heteroaryl, alkyl-heteroalkyl, alkynyl, alkylene, alkylene-hetero-alkylene, alkenylene, alkylene-hetero-alkenylene, alkynylene, or alkylene-hetero-alkynylene; and P1 and P2 can be the same or different; or P1 and P2, together with the same carbon atom to which they are attached, form a ring structure;

each of C and D, independently, is alkylene, alkylene-hetero-alkylene, alkenylene, alkenylene-hetero-alkenylene, alkylene-hetero-alkenylene, alkynylene, cycloalkylene, alkylene-cycloalkylene, alkylene-cycloalkylene-alkylene, alkenylene-cycloalkylene, alkenylene-cycloalkylene-alkenylene, alkylene-cycloalkylene-alkenylene, alkynylene-cycloalkylene, alkynylene-cycloalkylene-alkynylene, heterocycloalkylene, alkylene-heterocycloalkylene, alkylene-heterocycloalkylene-alkylene, alkenylene-heterocycloalkylene, alkenylene-heterocycloalkylene-alkenylene, alkylene-heterocycloalkylene-alkenylene, alkynylene-heterocycloalkylene, alkynylene-heterocycloalkylene-alkynylene, cycloalkenylene, alkylene-cycloalkenylene, alkylene-cycloalkenylene-alkylene, alkenylene-cycloalkenylene, alkenylene-cycloalkenylene-alkenylene, alkylene-cycloalkenylene-alkenylene, alkynylene-cycloalkenylene, alkynylene-cycloalkenylene-alkynylene, heterocycloalkenylene, alkylene-heterocycloalkenylene, alkylene-heterocycloalkenylene-alkylene, alkenylene-heterocycloalkenylene, alkenylene-heterocycloalkenylene-alkenylene, alkylene-heterocycloalkenylene-alkenylene, alkynylene-heterocycloalkenylene, alkynylene-heterocycloalkenylene-alkynylene, arylene, alkylene-arylene, alkylene-arylene-alkylene, alkenylene-arylene, alkenylene-arylene-alkenylene, alkylene-arylene-alkenylene, alkynylene-arylene, alkynylene-arylene-alkynylene, heteroarylene, alkylene-heteroarylene, alkylene-heteroarylene-alkylene, alkenylene-heteroarylene, alkenylene-heteroarylene-alkenylene, alkylene-heteroarylene-alkenylene, alkynylene-heteroarylene, alkynylene-heteroarylene-alkynylene; and C and D can be the same or different; and

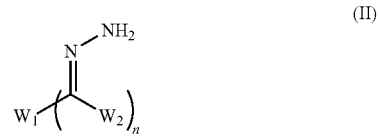

(II)

wherein, n is an integer of 2 or greater;

$W_1$ is alkylene, alkylene-hetero-alkylene, alkenylene, alkenylene-hetero-alkenylene, alkylene-hetero-alkenylene, alkynylene, cycloalkylene, alkylene-cycloalkylene, alkylene-cycloalkylene-alkylene, alkenylene-cycloalkylene, alkenylene-cycloalkylene-alkenylen, alkylene-cycloalkylene-alkenylene, alkynylene-cycloalkylene, alkynylene-cycloalkylene-alkynylene, heterocycloalkylene, alkylene-heterocycloalkylene, alkylene-heterocycloalkylene-alkylene, alkenylene-heterocycloalkylene, alkenylene-heterocycloalkylene-alkenylene, alkylene-heterocycloalkylene-alkenylene, alkynylene-heterocycloalkylene, alkynylene-heterocycloalkylene-alkynylene, cycloalkenylene, alkylene-cycloalkenylene, alkylene-cycloalkenylene-alkylene, alkenylene-cycloalkenylene, alkenylene-cycloalkenylene-alkenylene, alkylene-cycloalkenylene-alkenylene, alkynylene-cycloalkenylene, alkynylene-cycloalkenylene-alkynylene, heterocycloalkenylene, alkylene-heterocycloalkenylene, alkylene-heterocycloalkenylene-alkylene, alkenylene-heterocycloalkenylene, alkenylene-heterocycloalkenylene-alkenylene, alkylene-heterocycloalkenylene-alkenylene, alkynylene-heterocycloalkenylene, alkynylene-heterocycloalkenylene-alkynylene, arylene, alkylene-arylene, alkylene-arylene-alkylene, alkenylene-arylene, alkenylene-arylene-alkenylene, alkylene-arylene-alkenylene, alkynylene-arylene, alkynylene-arylene-alkynylene, heteroarylene, alkylene-heteroarylene, alkylene-heteroarylene-alkylene, alkenylene-heteroarylene, alkenylene-heteroarylene-alkenylene, alkylene-heteroarylene-alkenylene, alkynylene-heteroarylene, or alkynylene-heteroarylene-alkynylene; and each $W_2$, independently, is alkyl, cycloalkyl, heterocyclic, heterocycloalkyl, alkenyl, cycloalkenyl, aryl, heteroaryl, alkyl-hetero-alkyl, alkynyl, alkylene, alkylene-hetero-alkylene, alkenylene, alkylene-hetero-alkenylene, alkynylene, or alkylene-hetero-alkynylene;

the epoxy resin comprises glycidyl ether epoxy resin, glycidyl ester type epoxy resin, glycidyl amine type epoxy resin, aliphatic epoxy resin, alicyclic epoxy resin, or novolac epoxy resin; and the auxiliary material comprises a promoting agent, diluent, toughening agent thickening agent, adhesion promoter, brightener, pigment, addition component, coupling agent, filler, thixotropic agent, fire retardant, or antioxidant.

\* \* \* \* \*